United States Patent [19]
Lee et al.

[11] Patent Number: 5,585,210
[45] Date of Patent: Dec. 17, 1996

[54] MASK PATTERN OF A SEMICONDUCTOR DEVICE AND A METHOD OF MANUFACTURING FINE PATTERNS USING THE SAME

[75] Inventors: Dong-Seon Lee, Seoul; Chang-Jin Sohn, Kyungki-do; Woo-Sung Han, Kyungki-do; Gee-Hoo Kim, Kyungki-do, all of Rep. of Korea

[73] Assignee: Samsung Electronics Co., Ltd., Suwon, Rep. of Korea

[21] Appl. No.: 536,122

[22] Filed: Sep. 29, 1995

Related U.S. Application Data

[63] Continuation of Ser. No. 231,701, Apr. 22, 1994, abandoned.

[30] Foreign Application Priority Data

Apr. 22, 1993 [KR] Rep. of Korea ............... 93-6805
Jul. 15, 1993 [KR] Rep. of Korea ............... 93-13345

[51] Int. Cl.$^6$ .................................................. G03F 9/00
[52] U.S. Cl. ..................... 430/005; 430/312; 430/322; 430/394
[58] Field of Search .................... 430/5, 312, 322, 430/394

[56] References Cited

U.S. PATENT DOCUMENTS 4,767,695  8/1988  Ong et al. ................... 430/311
5,308,741  5/1994  Kemp ......................... 430/312

Primary Examiner—S. Rosasco
Attorney, Agent, or Firm—Cushman Darby & Cushman, L.L.P.

[57] ABSTRACT

A mask pattern for manufacturing a resist pattern of a semiconductor device through photolithography is provided with an additional mask pattern whose size is such that resist patterns are not formed after exposure on the spaces thereof. Using such a mask pattern, a manufacturing method of fine patterns enables the formation of specific patterns having an improved profile.

20 Claims, 20 Drawing Sheets s-poly(0.4/0.4)

s-poly(0.4/0.4 — 0.16)

s-poly(0.4/0.4-0.24/0.2)

s-poly(0.4/0.4-0.32/0.2)

s-poly(0.4/0.4-0.4/0.2)

s-poly(0.4/0.4-0.6/0.12)

MASK PATTERN OF A SEMICONDUCTOR DEVICE AND A METHOD OF MANUFACTURING FINE PATTERNS USING THE SAME

This is a continuation of application Ser. No. 08/231,701, filed on Apr. 22, 1994, which was abandoned upon the filing hereof.

Priority rights are based on Korean Patent Application Nos. 93-6805 and 93-13345, which Korean applications are hereby incorporated by reference.

BACKGROUND OF THE INVENTION

The present invention relates to masks (or "mask patterns") used in manufacturing a semiconductor device and to a method for manufacturing fine patterns using the same. More particularly, the present invention relates to a mask pattern having additional patterns on the spaces thereof so as to reduce the exposing dosage and a manufacturing method of fine patterns having an improved profile, which ultimately increases the cell capacitance of a semiconductor device significantly.

As semiconductor devices having high-integration and high-performance have been developed, more complicated structures have been employed, and as the result, techniques for manufacturing fine patterns on a semiconductor substrate are increasingly needed. It is widely known that such patterns of the semiconductor devices are manufactured through photolithography.

Photolithography is an essential process in manufacturing semiconductor devices. For example, in order to limit the selective diffusion region, photoresist material is coated on a dielectric layer of semiconductor substrate and is exposed and developed to form a photoresist pattern. Using the patterned photoresist layer, the dielectric layer is etched to form a window, and the patterned dielectric layer is used as a mask for selective diffusion process.

Recently, with the development of semiconductor manufacturing techniques (especially photolithography) and the reduction of design rules to submicron levels, the high-integration of semiconductor devices has been accelerated. However, certain factors greatly restrict the effective area of the capacitor and impedes further development of the semiconductor devices. Despite such restrictions, sufficient cell capacitance should be secured in order to improve the read-out capability of a semiconductor memory cell and to reduce the soft error rate. Therefore, research and development has continued in the field of photolithography, so as to find solutions to these problems.

In photolithography, a mask pattern is essential for the formation of any pattern on a substrate. FIG. 1 is an example of a mask pattern layout for manufacturing a cell capacitor.

Referring to FIG. 1, a mask pattern P1 is for forming an active region, i.e., source and drain regions, a mask pattern P2 is for forming a gate electrode, a mask pattern P3 is for forming the wiring which connects the source region and a storage node, a mask pattern P4 is for forming a bit line and has a central contact hole designating the point of symmetry, and a mask pattern P5 is for forming the storage nodes. This layout is for forming a cell capacitor along a bit line and the manufacturing process therefor can be described as follows.

First, the bit line is formed to contact the drain region of a transistor, and dielectric material is deposited on the whole surface of the substrate to electrically insulate the bit line. Then, the dielectric material is partially removed to expose the portion which is connected electrically with the transistor's source region, and a storage node is formed on the insulation material to interconnect with the source region of the transistor through the partially removed portion of the insulation material.

To form resist patterns for the storage node, the above photolithography process is employed using the mask pattern illustrated in FIG. 2. However, the edges become rounded off in the actually manufactured resist pattern on the substrate, due to the loss of resist at the edges thereof. This problem, often explained as a proximity effect, is serious when manufacturing rectangular pattern and can be exemplified as follows. During exposure, those portions marked with an "a" in FIG. 2 are relatively over-exposed, so that the patterns themselves are actually developed such that the size of the desired pattern (which would ideally correspond to the size of the mask portions indicated by numeral 10) is reduced, thereby producing a smaller storage node.

Accordingly, research and development on improving the structure of a storage node constituting a cell capacitor has continued. For example, the fin-structure type (of Fujitsu), the box type (of Toshiba), the spread-stacked capacitor structure (also by Toshiba), the cylinder structure (Mitsubishi) and others are suggested.

However, such efforts to increase cell capacity by improving the structure of the storage node are not easy, in light of design rule restrictions and an increase in the defect ratio owing to a more complicated process. Thus, the need for such a method to overcome this problem becomes heightened to ensure sufficient cell capacity.

Meanwhile, a method for manufacturing patterns using the photolithography will be described in detail below.

First, on a substrate desired to be patterned such as a semiconductor wafer, a dielectric layer or a conductive layer, a photoresist layer made of organic materials which has the characteristic of changing its solubility to an alkaline solution before and after exposure to ultraviolet light, X-ray radiation, etc. is formed. The resist layer is selectively exposed by employing a mask pattern over the photoresist layer, and is then developed to remove the portion having high solubility (in the case of a positive resist, removing the exposed portion) and to thereby leave the portion having low solubility and form resist patterns. Etching the substrate of the portion on which the resist has been removed to form patterns, and then removing the remaining resist, gives desired patterns.

Since fine patterns of high resolution can be obtained, the patterning method by the above-described photolithography is widely used. However, in order to form finer patterns, still further improvement in the manufacturing process is necessary.

The linewidth of the fine patterns formed after developing the photoresist layer is required to be the same as that of the photomask at a particular reduction ratio. However, since many process steps are required in photolithography, it is very difficult to keep the linewidth of the patterns consistent. The variation of the linewidth is mainly due to (a) the difference of exposing dosage owing to the difference of the thickness of resist, and (b) light interference due to the diffused reflection of the light over the topography (S. Wolf and R. N. Tauber, Silicon Processing for the VLSI Era, vol. 1, p 439, 1986, herein incorporated by reference). A more detailed description is given below.

Photoresist is coated on a substrate while spinning the substrate at a speed of 100 to 1000 rpm. Then, the rotation speed of the substrate is increased to about 2000 to 6000 rpm and the photoresist is radially spread by the centrifugal force, to form a photoresist layer having uniform thickness on the substrate.

At this time, if the substrate has already been patterned, a bulk effect (a phenomena of the photoresist being partially thickened owing to a step) is generated where the step exists.

Referring to FIGS. 3A and 3B, an example of the conventional line & space-type mask pattern (1) in FIG. 3A is used to expose a predetermined portion of a resist layer (2) formed on a substrate (3) having a step (S) (FIG. 3B). Here, the resist layer (2) formed on the substrate (3) with step has a thickness difference according to the height differential of the step. When exposing the resist layer using the conventional line & space-type mask pattern on the portion having a step, that is, having different resist thicknesses, since the same dosage is applied throughout the whole resist layer regardless of thickness, various problems occur. In particular, as devices become highly integrated, complicated structures are employed, and as the result, the number of steps increases. Thus, when coating the photoresist, the resist patterns having thickness differences at the steps are formed, and with the increased number of steps, patterns having a uniform profile may not result and pattern bridging and residue are increasingly induced. In FIG. 3B, given the use of a positive photoresist, if the exposing dosage is adjusted to accommodate the thinner portion of the photoresist (A), the lower portion of the step (B), i.e., the thicker portion of the photoresist, is under-exposed and, after development, this thicker portion may not be entirely developed, so that a residue remains. On the other hand, if the exposing dosage is set for the thicker portion of the photoresist, the upper portion of the step, i.e., the thinner portion of the photoresist, is over-exposed, and results in thinner patterns than expected.

Such an undesirable phenomenon is the result of the following circumstances. To form an excellent resist pattern, the focus of the light when performing the light exposure should coincide with a central line C of a thickness of the resist layer. That is, since the exposing area at the surface of the resist is symmetrical to the light exposing area at the lower surface of the resist with respect to the focal point, when the focal point coincides central line C of the thickness of the resist layer, the light exposing areas of the top and bottom surfaces thereof are identical, thereby enabling a sharply defined light intensity. However, since the thickness of the resist layer formed on the wafer having a step is not constant according to the substrate area, it is virtually impossible to make the central line C of the thickness of the whole resist layer coincide with the focal point of the light. That is, for example, since the focal line of the light at the step having a relatively thick resist is above the central line with respect thereto, the lower exposing range of the resist becomes broader than the upper exposing range. This means that the exposure energy dosage at the lower portion of the resist is relatively insufficient. The insufficient exposure generates undesirable variations in linewidth, bridging, residue, etc. Accordingly, the resist pattern profile becomes poor, so that the substrate cannot be etched properly.

As described above, when a mask pattern consistent with a desired resist pattern is used to form resist patterns, a dosage difference is induced according to the pattern shape, and thus, patterns having good and uniform profile may not be obtained.

SUMMARY OF THE INVENTION

The inventors of the present invention have developed a mask pattern which facilitates the manufacture of resist patterns whereby selective portions are differently exposed owing to the use of peculiar mask patterns such as the above-mentioned rectangular pattern and those applied to a step region. That is, one object of the present invention is to provide mask patterns which can give fine patterns having reduced pattern loss at the edges thereof and having a good profile, by partially controlling the dosage when exposing photoresist having different thicknesses at a step portion.

Another object of the present invention is to provide a method for manufacturing fine patterns which have the same shape as the mask pattern even at the edge portion and the thus-increased area ultimately increases the capacity of a cell capacitor, and which produce a good profile by using the above mask pattern.

To accomplish the object of the present invention, there is provided a mask pattern for manufacturing resist patterns through photolithography, wherein an additional pattern whose size is such that resist patterns are not formed after exposure is provided in the overexposing region of the spaces of the mask pattern.

Another object of the present invention is accomplished by a manufacturing method of fine patterns comprising the steps of: manufacturing a photoresist layer on a substrate, exposing a desired portion of the photoresist layer using a mask pattern including an additional pattern whose size is such that resist patterns are not formed after exposure on the unused spaces of the mask pattern, and developing the exposed photoresist layer.

Especially, the mask pattern is preferably a matrix type pattern (in the present invention, a matrix pattern is defined as a mask pattern in which a series of crossing spaces are formed) and the above-mentioned additional pattern is provided in the crossing spaces which separate each segment of the matrix pattern.

The additional pattern may be positioned in the crossing spaces of the matrix pattern and connected to the edges of the matrix pattern or may be inserted into the spaces. Also, it is preferable that the size of the additional pattern is such that the pattern resolution ranges from $0.1\lambda/NA$ to $0.4\lambda/NA$ (where $\lambda$ is the wavelength of the exposing light and NA is the numerical aperture of the exposing lens). The shape of the additional pattern is not restricted and any pattern that can exclude undesirable pattern formation owing to overexposure may be employed.

Especially, examples of such additional patterns to be provided in the spaces of the matrix pattern are the connection-type being connected to the edge portion of the matrix pattern (as shown in FIG. 4), the insertion-type being inserted into the crossing spaces (as shown in FIG. 5), and the line-type which interconnects segments of the matrix pattern (as shown in FIGS. 6, 7 and 8). The supplemental line-type additional pattern among the various modifications could be provided in the spaces of the matrix pattern along the x-axis direction (the horizontal lines of FIG. 6), the y-axis direction (the vertical lines of FIG. 7), or both directions (the crossed lines of FIG. 8).

The mask pattern of the present invention including the additional pattern therein and applied on a substrate having a step is arranged on a relatively thin photoresist layer portion formed on a substrate having a step. Also, the preferred additional pattern is the dot-type, the matrix-type or the line-type and is incorporated as an insertion-type pattern or a connection-type pattern.

BRIEF DESCRIPTION OR THE DRAWINGS

The above objects and advantages of the present invention will become more apparent by describing in detail preferred embodiments thereof with reference to the attached drawings, where like elements are indicated by the same reference numerals, and in which.

DETAILED DESCRIPTION OF THE INVENTION

In the present invention, the defect ratio can be reduced by controlling the dosage or amount of an exposure light according to manufacturing patterns by using a main mask pattern and an additional mask pattern disposed between the main segments of the main mask pattern.

The additional mask pattern could be advantageously manufactured by using the conventionally used materials in manufacturing the mask pattern itself, such as chrome. Also, the additional pattern included in the mask pattern of the present invention only reduces the dosage of the exposing light and does not change its phase, and the effects of interference may be excluded, to thereby produce a resist pattern without undesirable consequences due to unconventional processing.

Hereinafter, the present invention will be described in detail with respect to preferred embodiments.

First, examples applied to a rectangular mask pattern for manufacturing a storage node will be explained.

Figure 4:
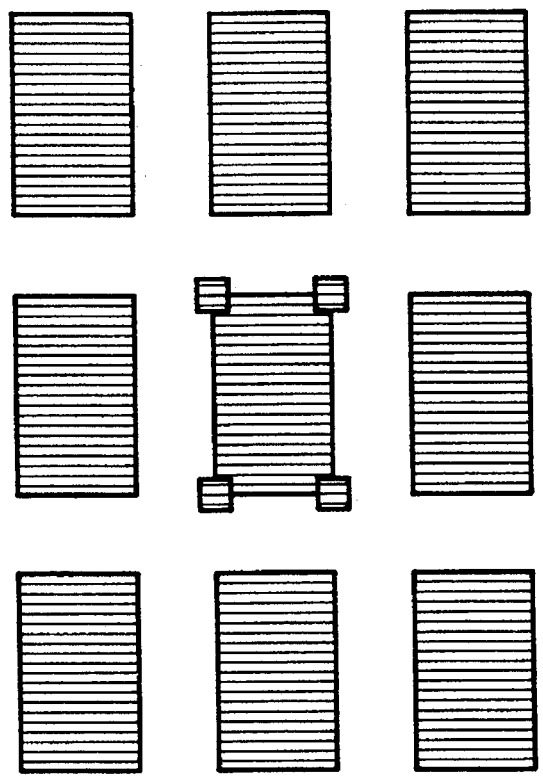
FIG. 4 is a mask pattern for manufacturing a storage node according to a first embodiment of the present invention.
Figure 5:
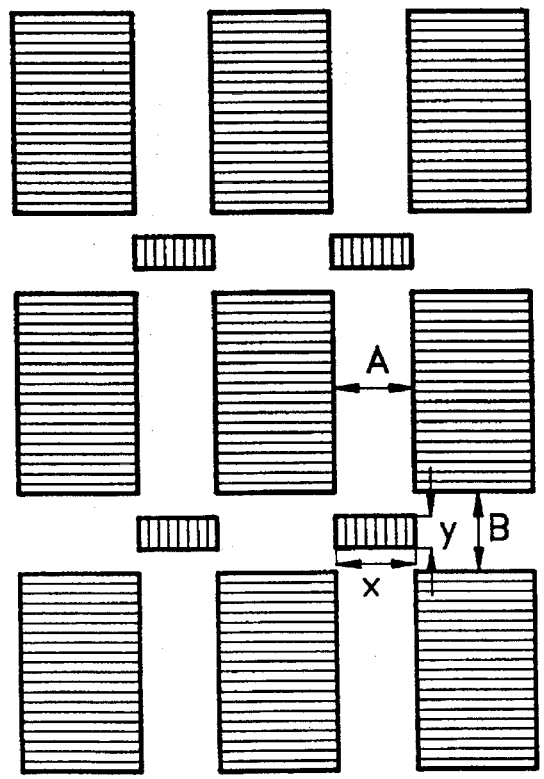
FIG. 5 is a mask pattern for manufacturing a storage node according to a second embodiment of the present invention.

FIGS. 4 and 5 illustrate mask patterns according to first and second embodiments of the present invention, respectively, which are obtained by connecting an additional mask pattern to the edges of the main mask pattern as shown in FIG. 4, or by inserting a non-interconnected additional mask pattern in the crossing spaces of the mask pattern as shown in FIG. 5. More specifically, the mask pattern in FIG. 4 comprises a plurality of main mask portions 10 defining spaces therebetween, while the additional mask pattern comprises a plurality of supplemental mask portions 12 connected to the main mask portions and disposed at least partially within the spaces. The additional mask pattern, comprising the supplemental mask portions, is sized to prevent exposure light from overexposing the resist pattern through the spaces.

The embodiment in FIG. 5 has the additional mask pattern thereof comprising supplemental mask portions 14, which are also disposed within the spaces of the main mask portions, but are not interconnected to the main mask portions.

Figure 1:
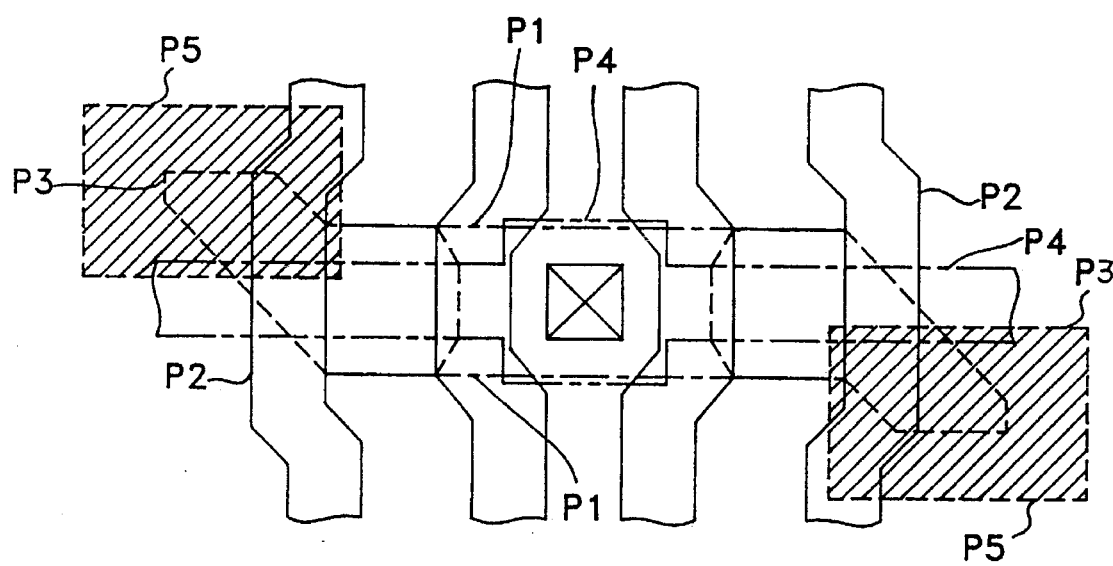
FIG. 1 is an example of a layout for manufacturing a cell capacitor.
Figure 2:
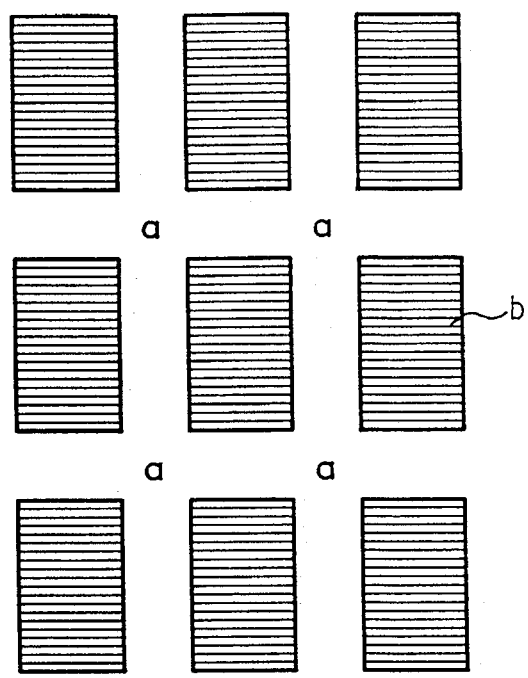
FIG. 2 is a mask pattern for manufacturing the conventional storage node.
Figure 3A:
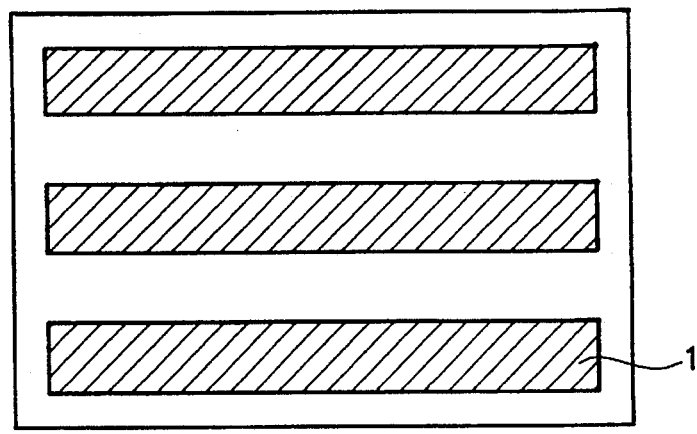
FIG. 3A is an example of the conventional mask pattern for exposing a predetermined portion of a resist layer.
Figure 3B:
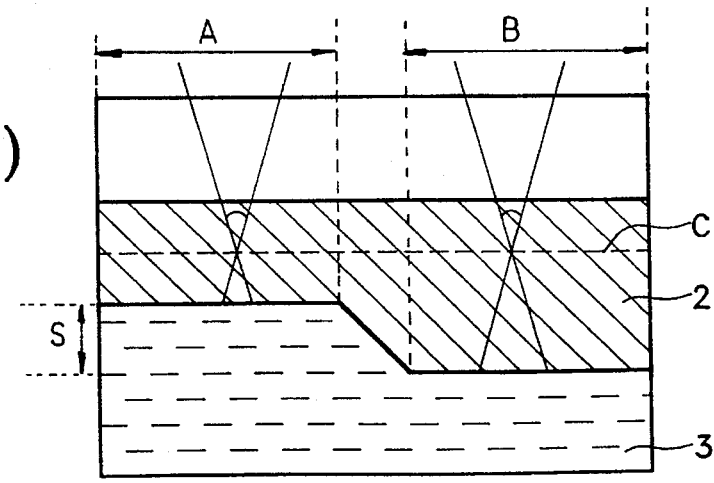
FIG. 3B shows a resist layer formed on a substrate having a step.

The pattern loss at the edge portion of the storage node is prevented by providing the additional pattern (such as in the above-described embodiments) into the region marked "a" in FIG. 2, which is over-exposed when using the conventional mask pattern. Here, the masking effect of the exposed light is determined by the additional pattern size. In order to determine the preferable size of the additional pattern, the present inventors observed the sizes of formed patterns, while changing the size of the insertion-type additional pattern of the second embodiment (FIG. 5) of the present invention.

Figure 9:
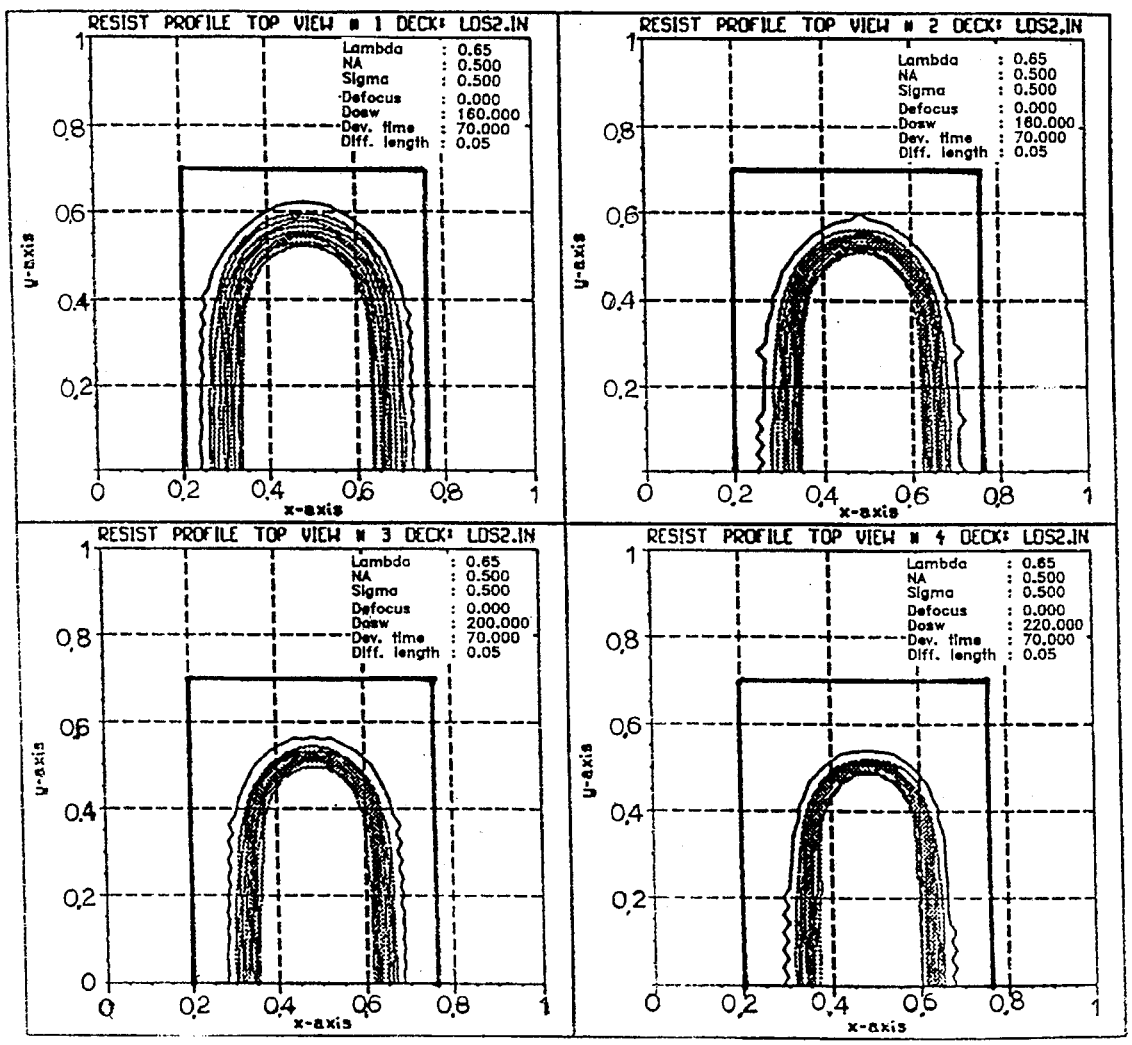
FIG. 9 illustrates simulation results obtained by using the conventional mask pattern.

FIGS. 9 to 15 are simulation results showing the effect of the present invention. Here, FIG. 9 corresponds to the results obtained by using the conventional mask pattern, while FIGS. 10 to 15 correspond to the results obtained by using the mask pattern having an inserted additional pattern according to the second embodiment of the present invention. In FIG. 9, the size of the conventional pattern was 0.56 μm by 1.4 μm, the wavelength (λ) of the exposing light was 0.365 μm, and the NA value of the projection lens was 0.5.

Figure 10:
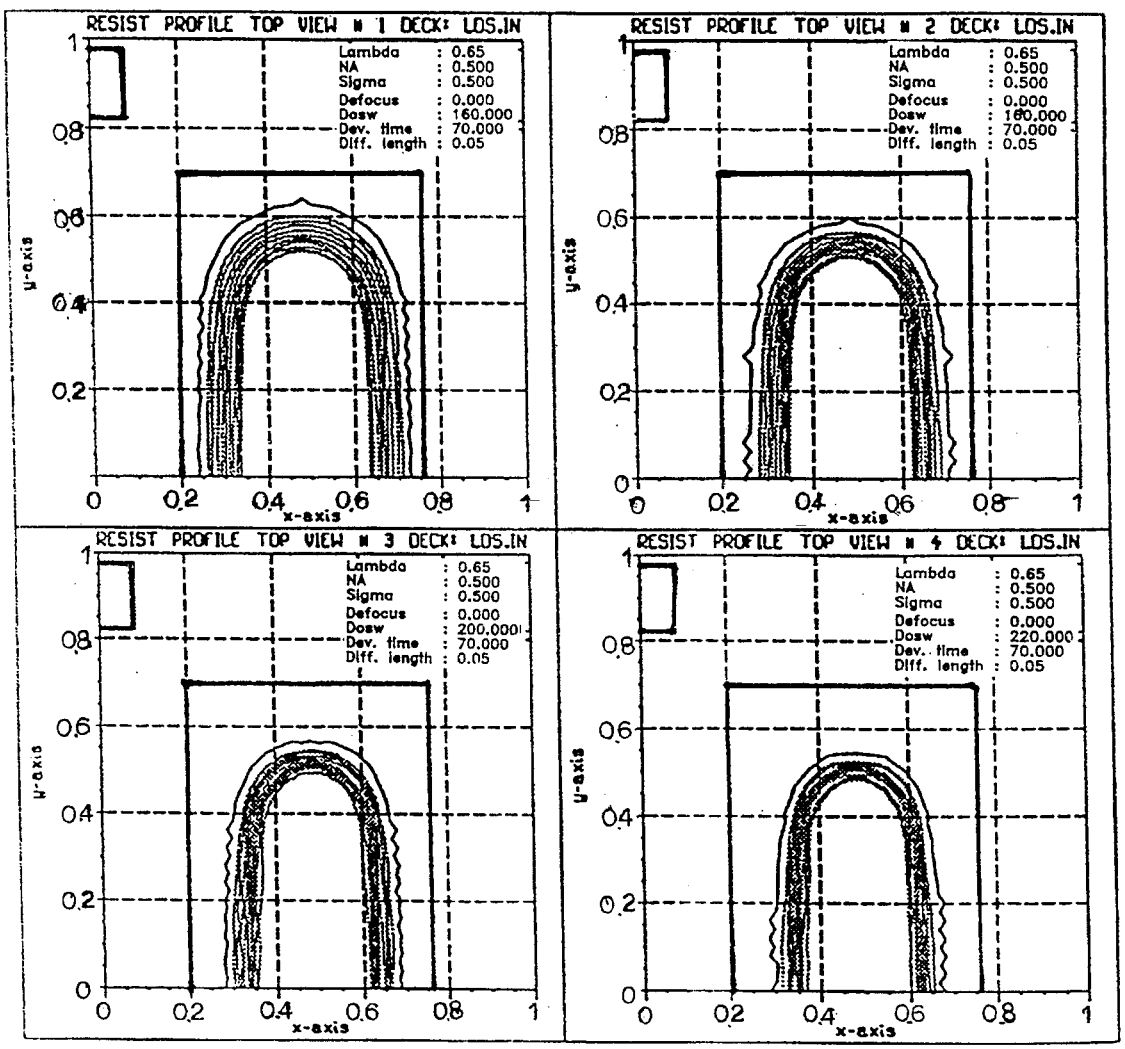
FIGS. 10, 11, 12, 13, 14 and 15 illustrate simulation results obtained by using the mask pattern having an inserted additional pattern according to the second embodiment of the present invention, and with six different ratios for the x and y dimensions of FIG. 5, respectively.
Figure 11:
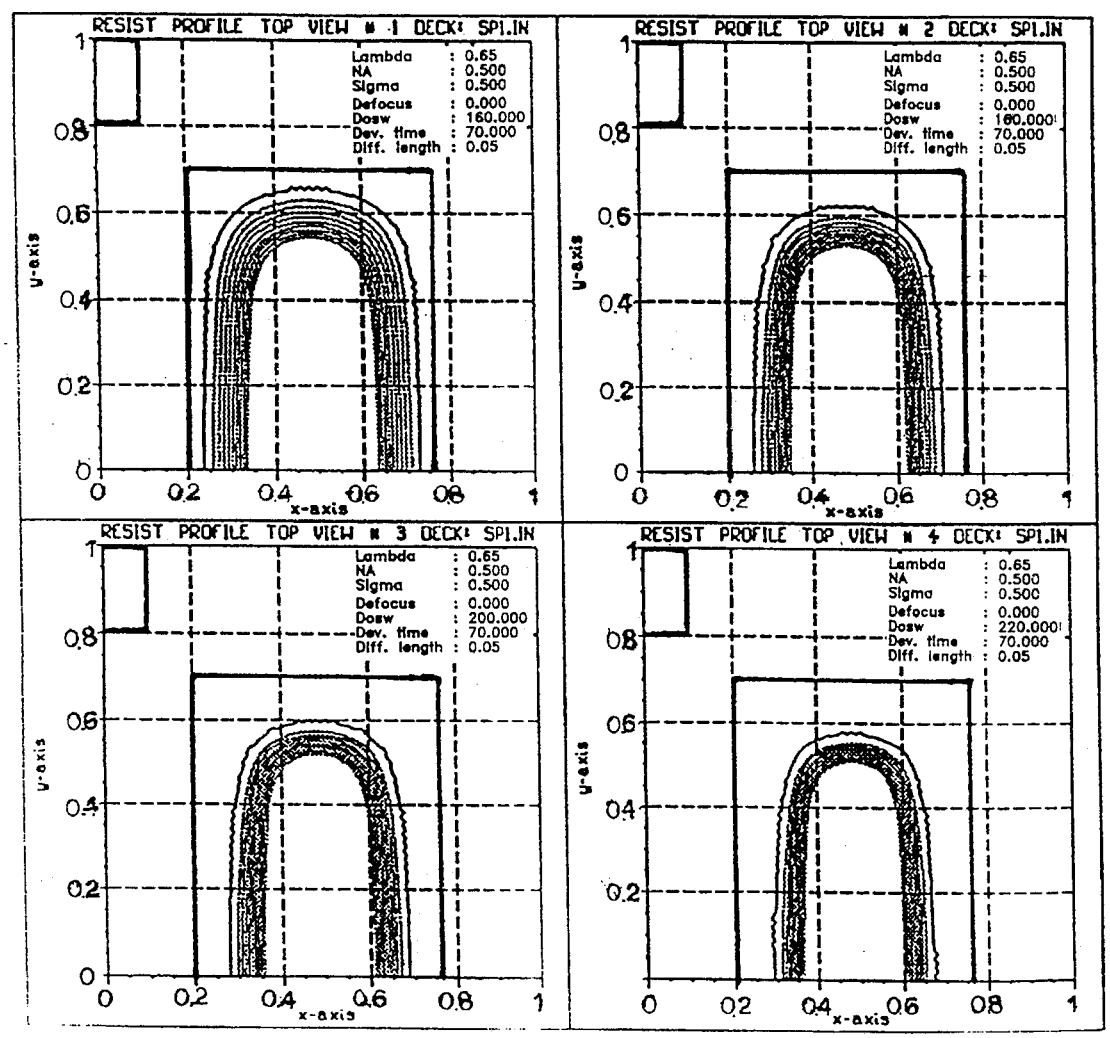
Figure 12:
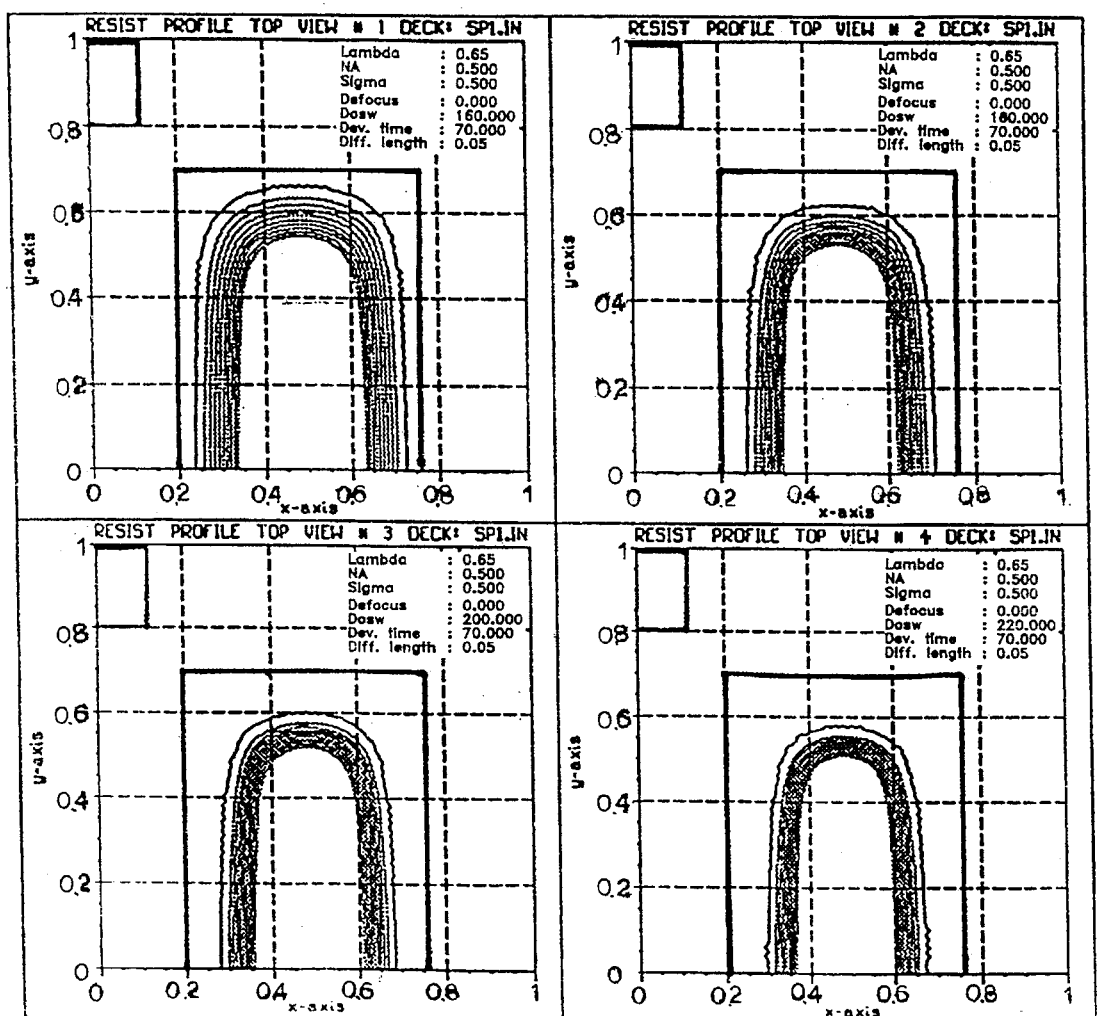
Figure 13:
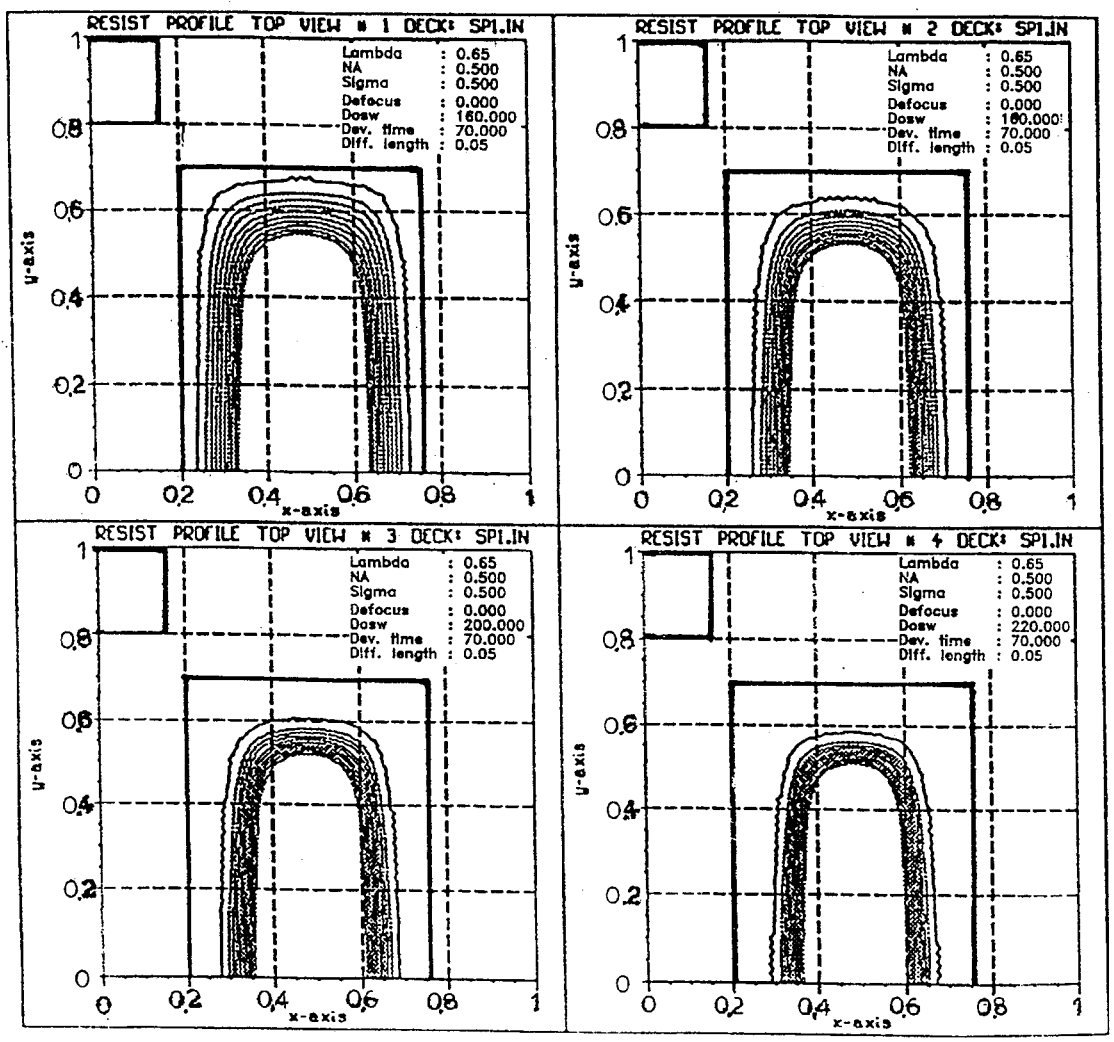
Figure 14:
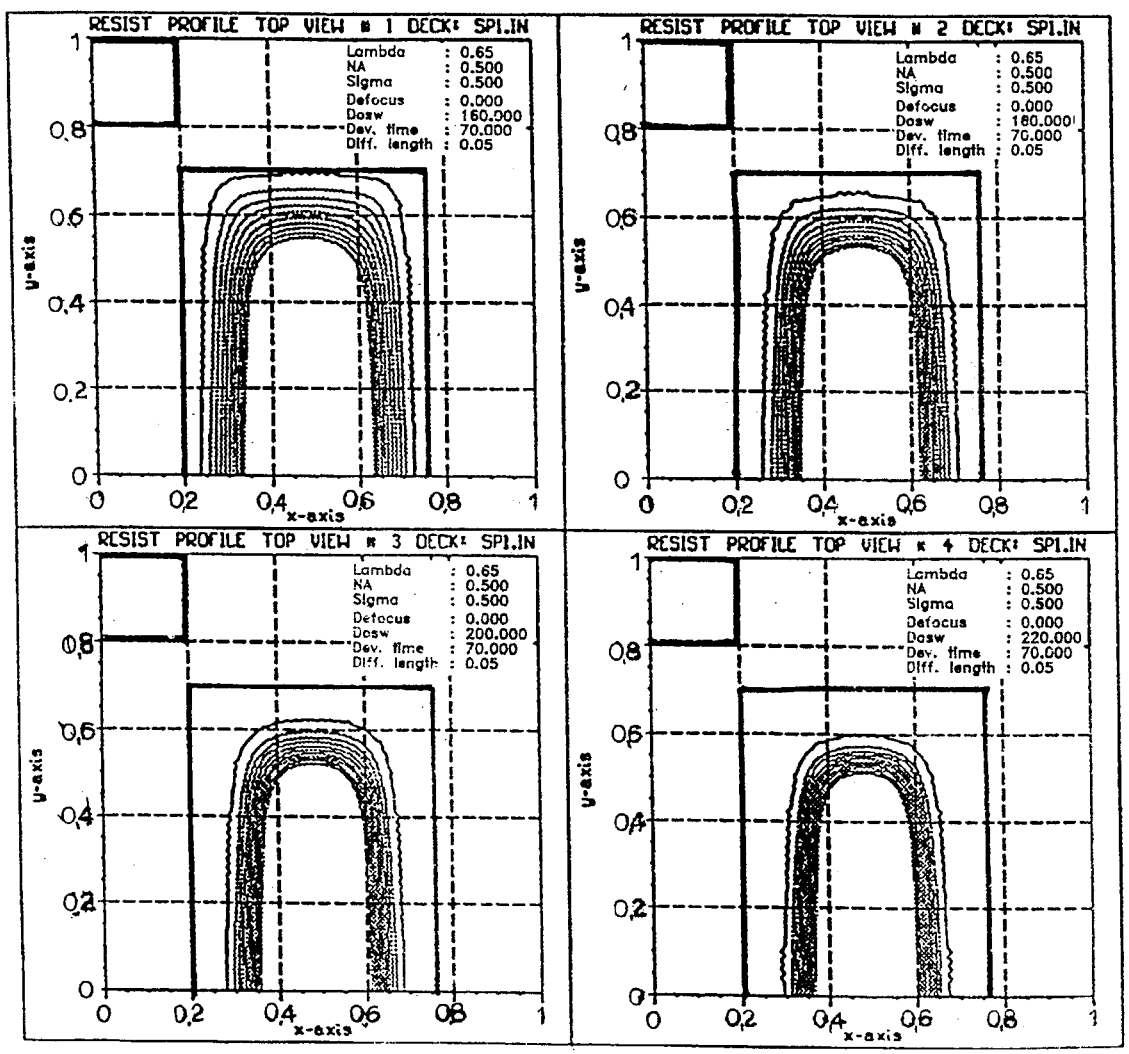
Figure 15:
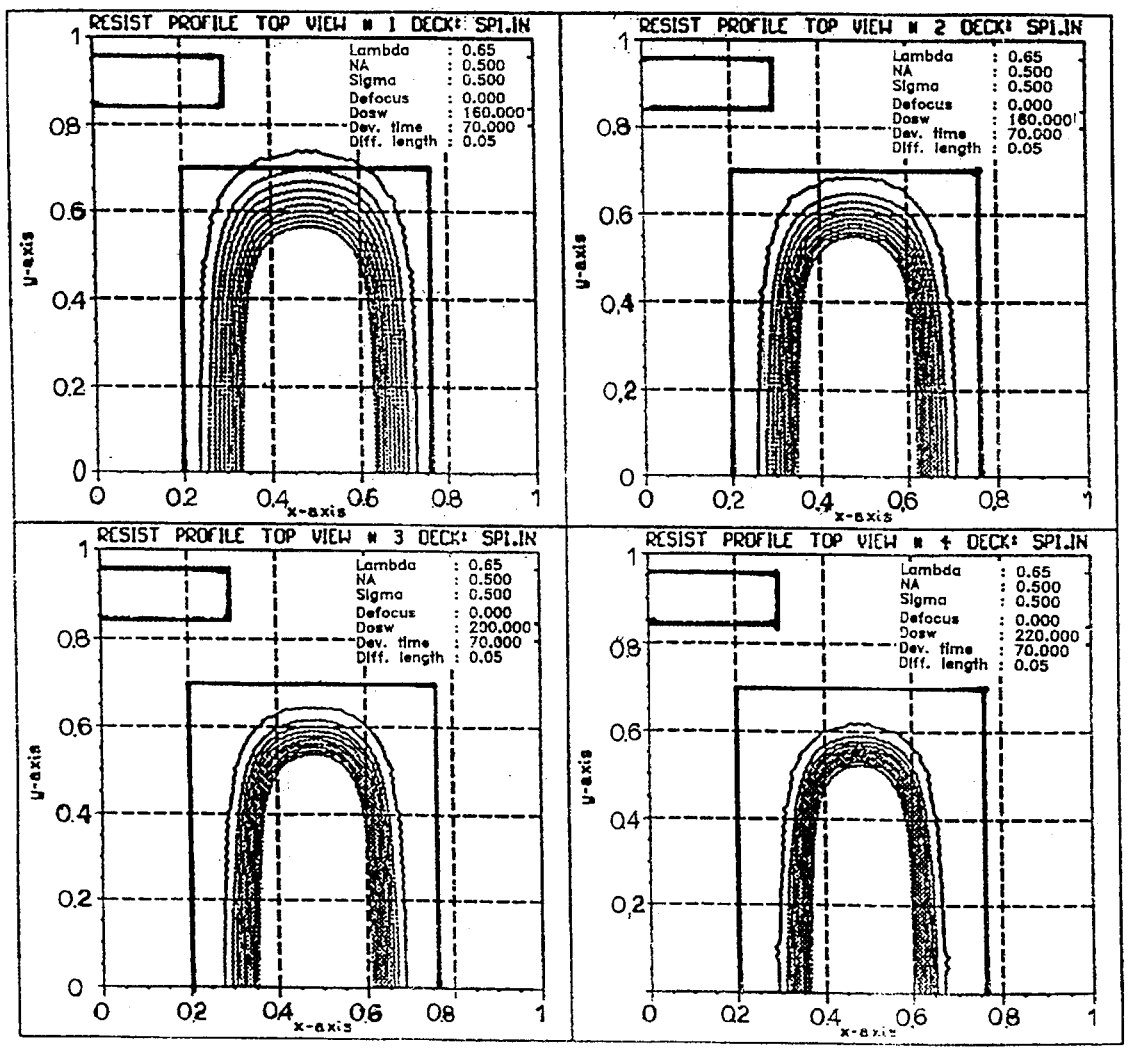

The simulation results were obtained by letting the distances A and B between each segment of pattern be 0.4 μm and 0.4 μm, and letting the additional pattern dimensions x and y be 0.16 μm and 0.16 μm for FIG. 10, 0.2 μm and 0.2 μm for FIG. 11, 0.24 μm and 0.2 μm for FIG. 12, 0.32 μm and 0.2 μm for FIG. 13, 0.4 μm and 0.2 μm for FIG. 14, and 0.6 μm and 0.12 μm for FIG. 15. In each of FIGS. 9 to 15, four simulation results are illustrated, which were obtained by varying the dosage of the exposing light, where the upper-left portion of each figure corresponds to a dosage of 160, the upper-right portion thereof corresponds to a dosage of 180, the lower-left portion corresponds to a dosage of 200, and the lower-right portion corresponds to a dosage of 220. It is confirmed that the greater the dosage, the smaller the formed patterns.

By comparing the simulation results, it is confirmed that the resist patterns formed by using the mask pattern having an additional pattern according to the present invention have an increased pattern area as a result of the decrease in pattern loss at the corners of the rectangle. It should be noted that the results shown in FIG. 13 (where the x/y value is 0.32/0.2) is the most preferable.

Figure 16:
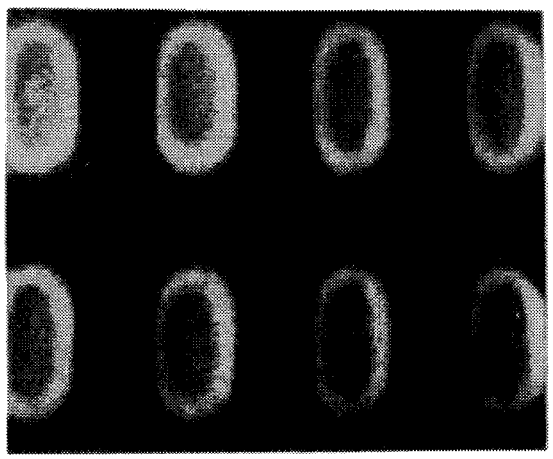
FIG. 16 is a photograph of a resist pattern resulting from the conventional mask pattern.
Figure 17:
FIGS. 17, 18 and 19 are photographs of resist patterns resulting from the mask pattern having an inserted additional pattern according to the second embodiment of the present invention, and using three different ratios for the x and y dimensions of FIG. 5, respectively.
Figure 18:
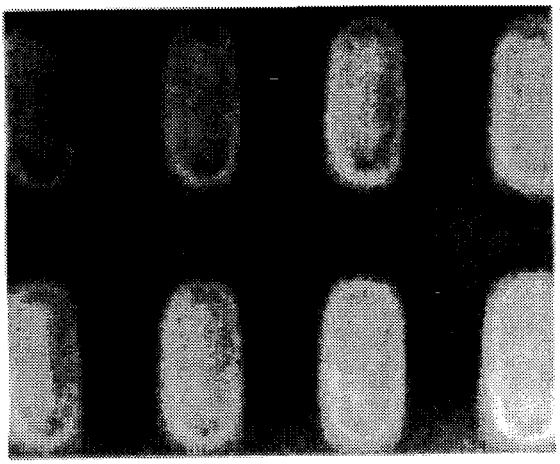
Figure 19:
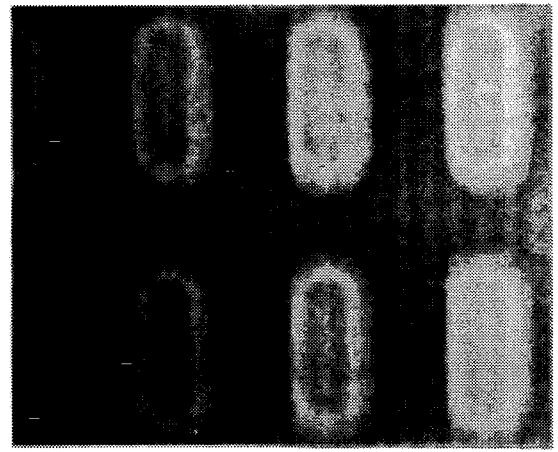
Figure 20:
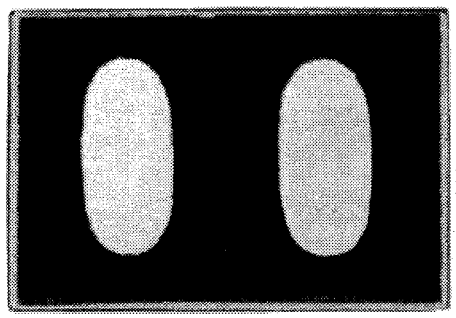
FIG. 20 is a photograph of a storage node pattern obtained by employing the conventional mask pattern.

Mask patterns with additional patterns having x/y values of 0.28/0.2, 0.32/0.2 and 0.36/0.2 were manufactured and resist patterns were formed by using these mask patterns. The results are respectively illustrated in FIGS. 17, 18 and 19 which show the photographs of the resist patterns formed by using a mask pattern according to the second embodiment. For comparison, FIG. 16 shows a resist pattern obtained by using conventional mask pattern.

It is confirmed from the photographs that the resist patterns manufactured by using the mask pattern of the present invention have increased pattern size especially at the sides of the vertically elongated rectangle and result in a closer pattern resemblance with respect to the original rectangular shape when compared with the resist patterns formed with the conventional mask pattern.

In conclusion, an increase in resist pattern at the edge portion is possible by decreasing the dosage at the relatively over-exposed portion by inserting an additional pattern in the mask pattern. This will increase the circumferential surface of the cylindrically formed capacitor as well as the surface area of the top portion thereof, and ultimately, will increase capacitance significantly. To confirm the effect roughly, the sum of the surface area of top portion and side portion of a cylinder having 0.5 μm height was theoretically calculated at about a 17% increase in the total surface area.

The effect of area increase was also obtained by using the mask pattern according to the first embodiment in which the additional pattern is connected to the matrix pattern, but the effect was not remarkable.

The present inventors also obtained good results by providing a thin, supplemental line-type additional pattern at each edge portion of the matrix pattern along the horizontal and/or vertical directions.

Figure 6:
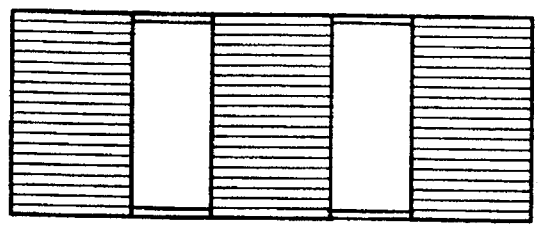
FIG. 6 is a mask pattern for manufacturing a storage node according to a third embodiment of the present invention.
Figure 6:
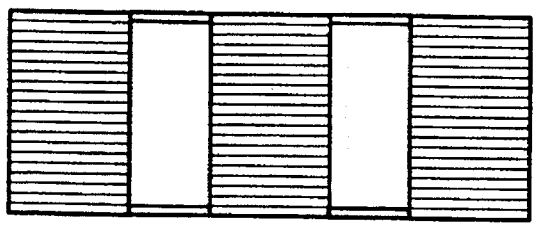
Figure 6:
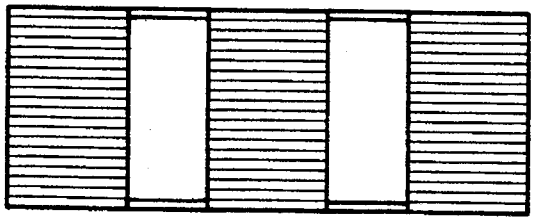
Figure 7:
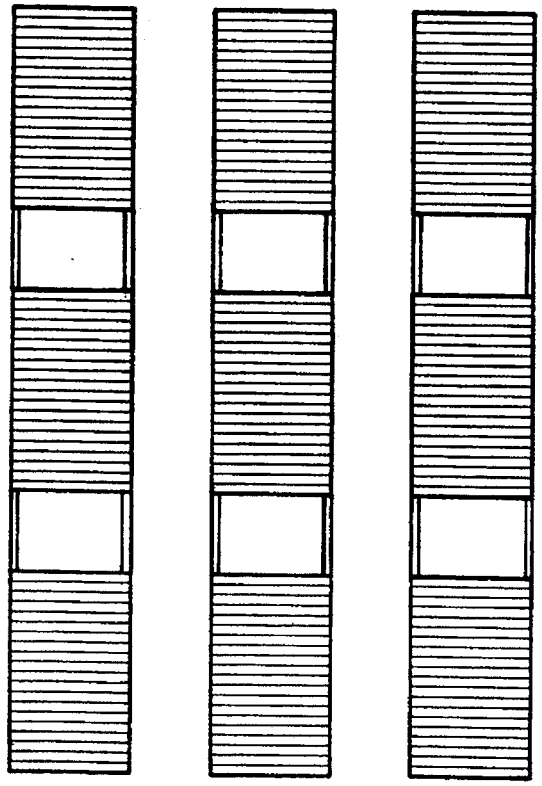
FIG. 7 is a mask pattern for manufacturing a storage node according to a fourth embodiment of the present invention.
Figure 8:
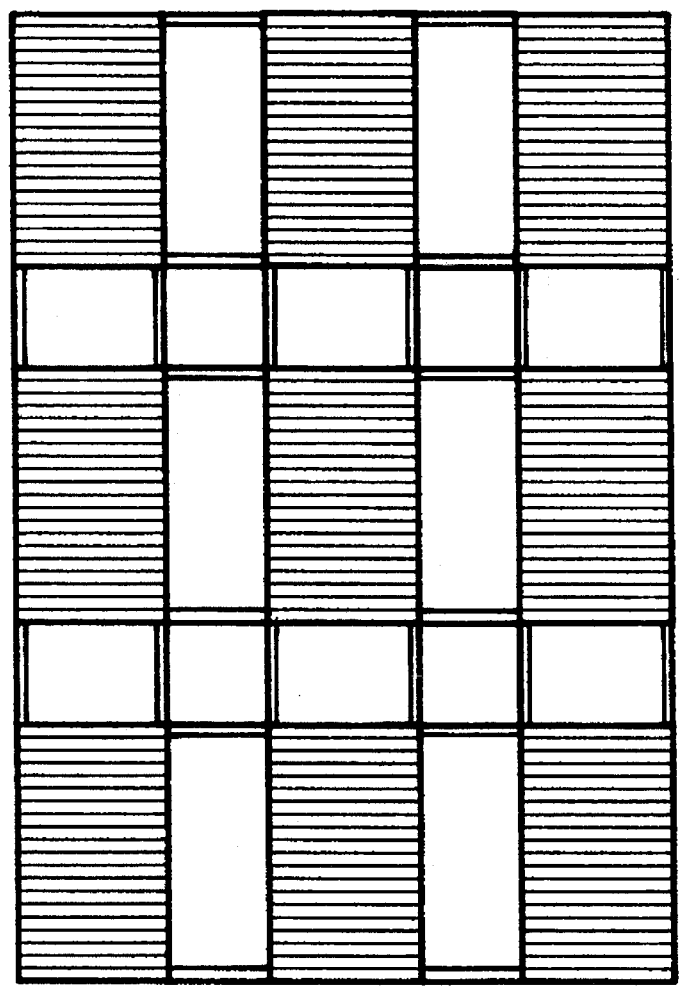
FIG. 8 is a mask pattern for manufacturing a storage node according to a fifth embodiment of the present invention.

FIG. 6 is a mask pattern according to the third embodiment of the present invention having a supplemental line-type additional pattern 16 in the x-axis direction, FIG. 7 is a mask pattern according to the fourth embodiment of the present invention having a supplemental line-type additional pattern 18 in the y-axis direction, and FIG. 8 is a mask pattern according to the fifth embodiment of the present invention having a supplemental line-type additional patterns along both the x-axis and y-axis. Here, although a somewhat varying magnitude of increase, according to the direction of the line-type pattern, was observed, at least 30% larger resist patterns could be obtained by using the mask pattern having the interconnecting line-type additional pattern.

When using a mask pattern whose supplemental line is provided along the y-axis, the areas along y-axis are remarkably augmented, while in the case of using the mask pattern having a supplemental line in the x-axis direction, the x-axis areas are predominantly increased so as to result in the preferred rectangular-type patterns which is faithful to the original design of the mask pattern, and thus the latter becomes the more appropriate mask pattern in the present invention. In the case of using the mask pattern having a supplemental line provided along both axes, a bridging problem arises owing to an excessive increase in pattern size. However, the effect of the present invention can be sufficiently obtained by controlling linewidth.

When providing a supplemental line-type additional pattern in the matrix pattern, since the mask pattern segments are congruous, increased surface area is advantageously obtained regardless of the type of supplemental line.

Resist patterns were actually fabricated using mask patterns of each of the three types of supplemental line formation and for the 64M DRAM design rule.

FIGS. 20 to 23 are photographs for comparing the storage node patterns obtained by employing the conventional mask pattern and the mask patterns according to the third and fourth embodiments of the present invention. Here, FIG. 20 was obtained by using the conventional mask pattern, while FIGS. 21 and 22 were both obtained by using the mask pattern according to the third embodiment, and FIG. 23 was obtained by using the mask pattern according to the fourth embodiment. These photographs were obtained via scanning electron microscopy.

Figure 21:
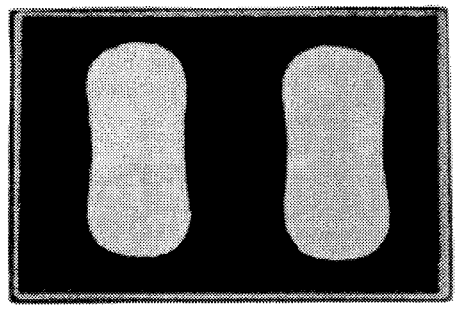
FIGS. 21 & 22 and FIG. 23 are photographs of a storage node pattern obtained by using the mask pattern according to the third and fourth embodiments of the present invention, respectively.
Figure 22:
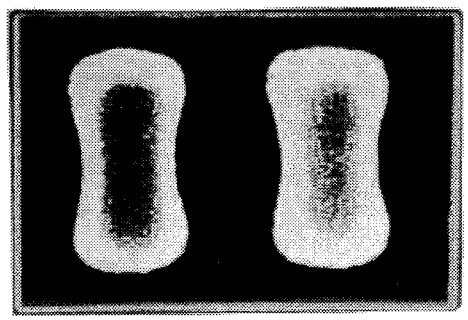

In the third embodiment, two cases, having horizontal (x-axis) supplemental linewidths of 0.16 μm (FIG. 21) and 0.20 μm (FIG. 22), were observed. Here, a positive-type PFI-26A was used as the photoresist, and the exposing conditions were a photoresist thickness of 1.05 μm, a stepper NA value of 0.5, a sigma value of 0.5, and an exposure time of 500 milliseconds. Referring to FIG. 21, the storage node patterns obtained by employing the supplemental line having a 0.16 μm width exhibits a good rectangular pattern which is faithful to the mask pattern design. When this is compared with the conventional patterns (FIG. 20), an approximately 40% increase in area and a 0.4 μm improvement in the depth of focus (DOF) can be seen. Referring to FIG. 22, the obtained patterns bear a somewhat peanut-shaped appearance, and a similar DOF improvement was obtained but the increase in area was about 50% with respect to the conventional patterns.

In the fourth embodiment, a vertical (y-axis) supplemental linewidth of 0.16 μm (FIG. 23) was observed and the exposing conditions were the same as the above-described third embodiment. From FIG. 23, it is confirmed that the increase in area along the y-axis is remarkable. In this case also, the increase in area was about 40% and the DOF was increased by about 0.4 μm over the results of the conventional patterns. Here, however, it should be noted that an excessive linewidth may cause bridging due to an overabundance of pattern size along the y-axis.

From the above results, it is concluded that preferred patterns are formed when a supplemental line along the x-axis, especially with a 0.16 μm linewidth, is employed.

The storage nodes illustrated in FIGS. 20 to 23 are formed by using positive photoresist, and the results of manufacturing storage nodes when using negative photoresist are illustrated below.

FIGS. 24A to 24G are plan-view photographs of storage nodes formed by using negative photoresist. Here, the conventional mask pattern and mask patterns according to the third, fourth and fifth embodiments of the present invention are contrasted to compare the resulting areas.

Figure 24A:
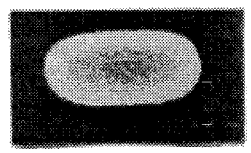
FIG. 24A is a plan-view photograph of a storage node formed by using a negative photoresist and the conventional mask pattern.
Figure 24B:
FIGS. 24B & 24C, 24D & 24E and 24F & 24G are plan-view photographs of a storage node formed by using a negative photoresist and mask patterns according to the third, fourth and fifth embodiments of the present invention, respectively.
Figure 24C:
Figure 24D:
Figure 24E:
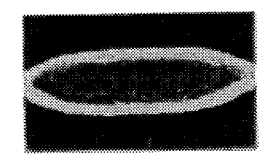
Figure 24F:
Figure 24G:

FIG. 24A corresponds to the storage node when using the conventional mask pattern, FIG. 24B corresponds to the storage node when using a horizontal supplemental linewidth of 0.16 µm, FIG. 24C corresponds to the storage node when using a horizontal supplemental linewidth of 0.20 µm, FIG. 24D corresponds to the storage node when using a vertical supplemental linewidth of 0.16 µm, FIG. 24E corresponds to the storage node when using a vertical supplemental linewidth of 0.20 µm, FIG. 24F corresponds to the storage node when using a crossed linewidth of 0.16 µm, and FIG. 24G corresponds to the storage node when using a crossed linewidth of 0.20 µm. From FIG. 24G, which illustrates the potential for bridging between adjacent storage nodes when using a crossing-type additional pattern, it is known that such resist patterns are more dangerous than the resist patterns obtained by using a horizontal or vertical supplemental line. However, this problem could be sufficiently overcome by controlling the linewidth.

Figure 23:
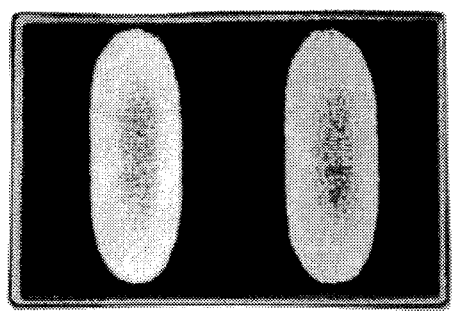

When comparing FIGS. 21–23 with FIG. 24, it is confirmed that the effects obtained when using negative photoresist are the same as those obtained using positive photoresist, which means that excellent fine patterns can be obtained by using the mask pattern of the present invention, regardless of the type of resist.

Figure 25:
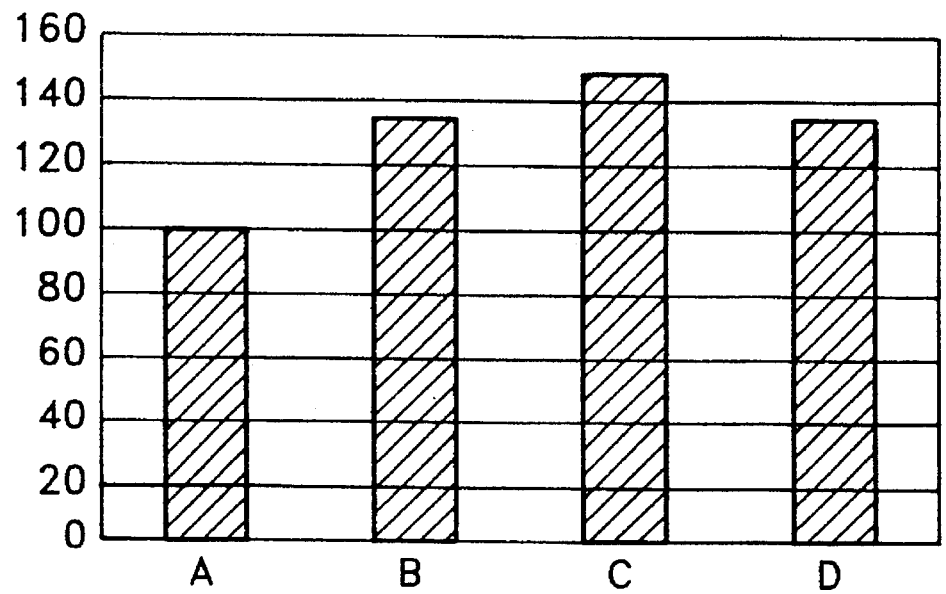
FIGS. 25 and 26 are graphs showing comparative areas of each storage node shown in FIGS. 20–23 and in FIGS. 24A–24G, respectively.
Figure 26:
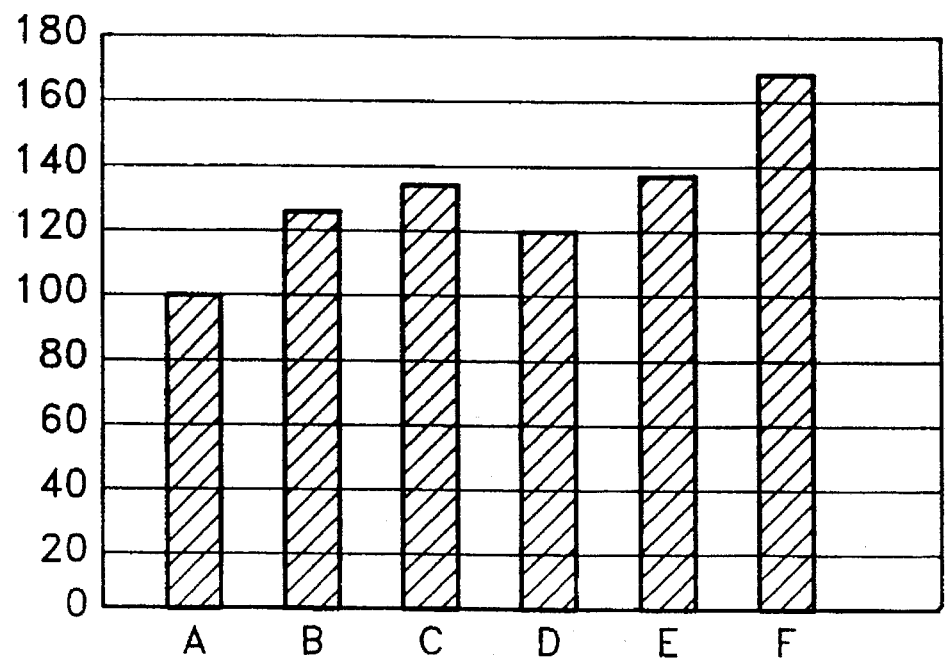

In order to clearly compare the area increase of the storage nodes formed by employing supplemental line-type additional patterns with the area of the conventional storage node, relative pattern areas according to the present invention are depicted in a graph, letting the conventional pattern area be the standard "100." Here, FIG. 25 is a graph illustrating the areas of the storage nodes in which FIGS. 20, 21, 22 and 23 correspond to FIGS. 25A, 25B, 25C and 25D, respectively, and FIG. 26 is a graph illustrating the areas of each storage node in which FIGS. 24A, 24B, 24C, 24D, 24E, 24F and 24G correspond to 26A, 26B, 26C, 26D, 26E, 26F and 26G, respectively. From the graphs of FIGS. 25 and 26, it may be confirmed again that the pattern area can be greatly increased by using a mask pattern including a supplemental line-type additional pattern according the above-mentioned embodiments of the present invention.

The inventors also manufactured resist patterns using a mask pattern in which a squared notch was removed from the shorter sides of each segment of the embodiments of FIGS. 6, 7 and 8. This resulted in achieving a good effect of area increase for mask patterns having a horizontal line-type and crossed-line-type additional pattern as in the above-mentioned various embodiments. Though the manufacture of such mask patterns is difficult and complicates the pattern manufacturing process, this type of mask pattern is nevertheless included in the scope of the present invention.

As described above, the effect of area increase could be obtained by manufacturing fine patterns using a mask pattern having an additional pattern in the over-exposed regions, which ultimately contributes to an increase in capacitance.

As for another application of the present invention, an example of manufacturing fine patterns having an improved profile, that is, a method for improving the profile of the resist patterns formed on a substrate having a step being subjected to different exposing dosages according to resist thickness, will now be described.

Figure 27A:
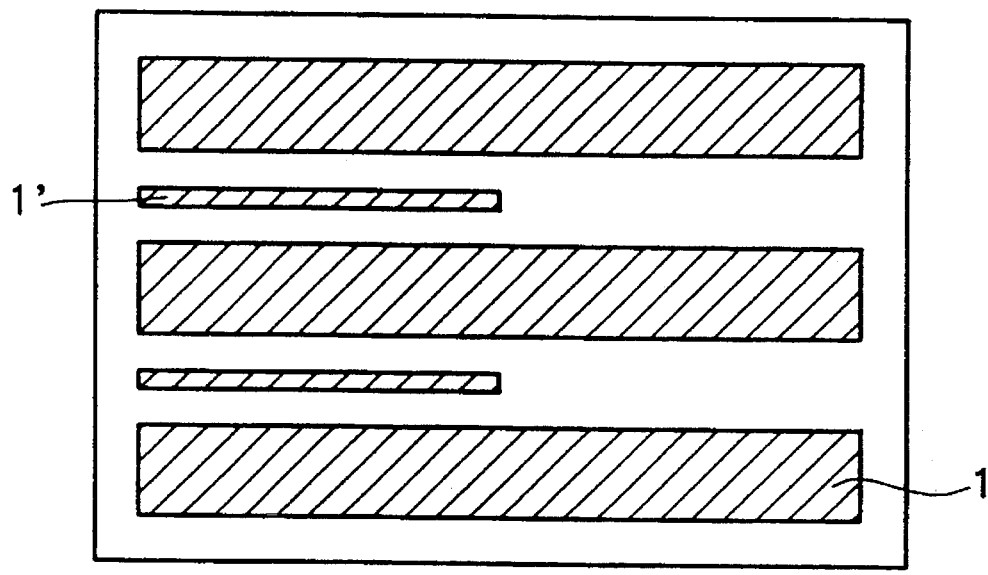
FIG. 27A is a mask pattern according to a sixth embodiment of the present invention.
Figure 27B:
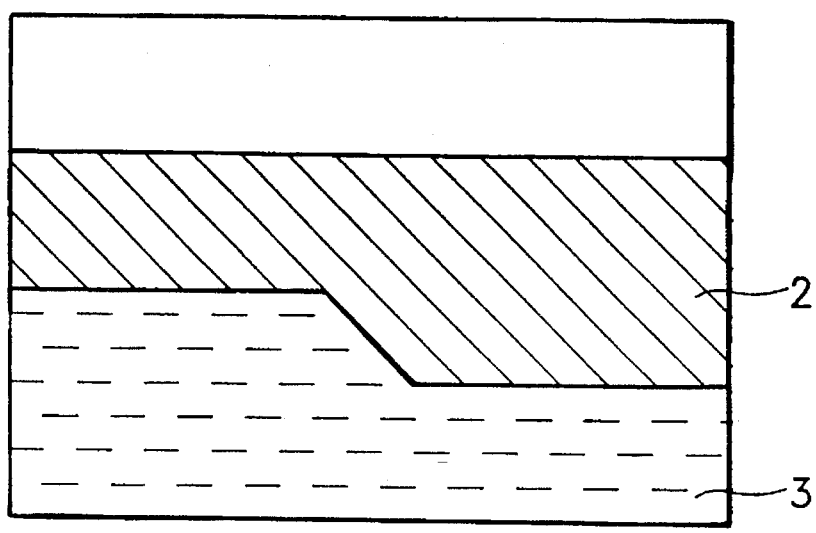
FIG. 27B shows a resist layer formed on a substrate having a step.

FIG. 27A is a mask pattern according to a sixth embodiment of the present invention and FIG. 27B shows a resist layer having a step. That is, the mask pattern according to the sixth embodiment of the present invention is manufactured by inserting a horizontal additional pattern (1') in the conventional mask pattern (1) which is lined up over the thinner resist layer, in order to reduce the dosage exposing the thinner resist portion when setting the dosage for the thicker resist portion. (It should be noted that in a resist layer 2 on a substrate 3, the resist on the lower portion of the step is thicker than that on the upper portion thereof.) The inserted horizontal pattern is an additional pattern which reduces the dosage during exposure without patterning and plays the role of appropriately reducing dosage in the over-exposed region without additional pattern. Therefore, the defects caused by the patterns having a poor profile due to a large resist thickness differential at step regions can be avoided.

As for the additional pattern included in the mask pattern of the present invention, any type may be employed, regardless of shape or size, provided the objects of the present invention are accomplished.

Figure 28A:
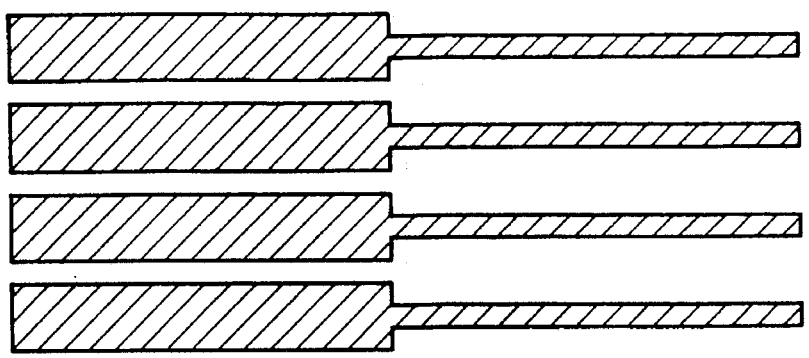
FIGS. 28A, 28B, 28C, 28D and 28E are mask patterns according to the seventh to eleventh embodiment of the present invention, respectively.
Figure 28B:
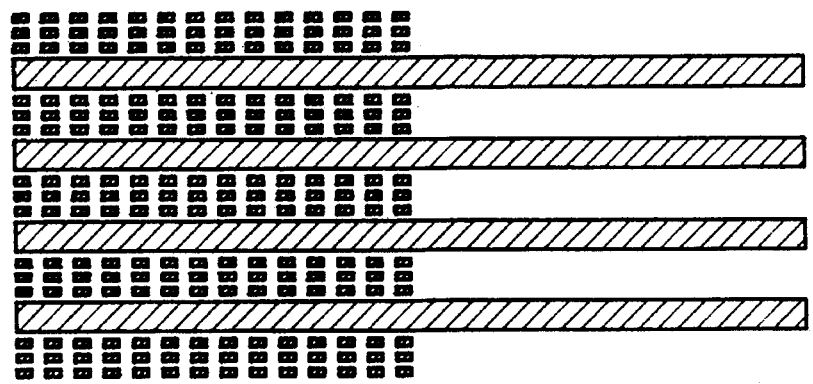
Figure 28C:
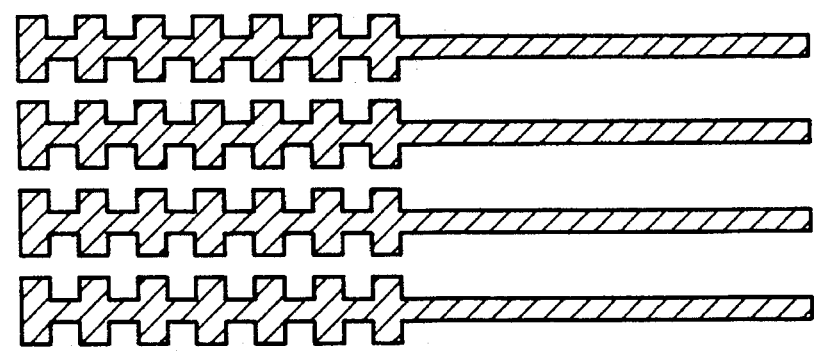
Figure 28D:
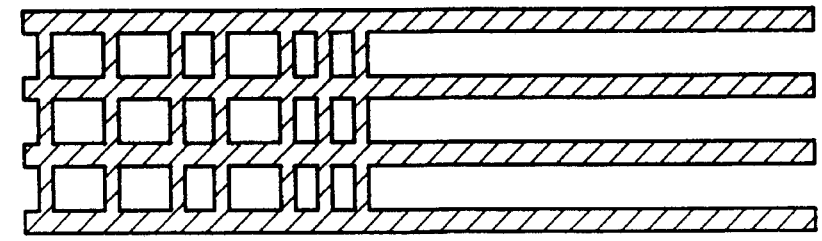
Figure 28E:
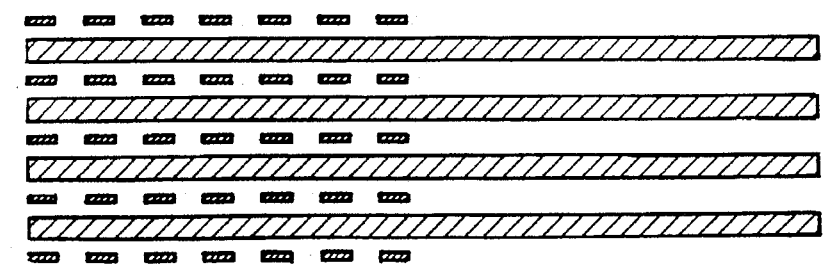

FIGS. 28A to 28E are mask patterns according to the seventh to eleventh embodiments of the present invention which accomplish the objects of the present invention. These are a horizontal connection-type pattern (FIG. 28A), a matrix insertion-type (FIG. 28B), a dotted connection-type (FIG. 28C), a checkered vertical-type (FIG. 28D), and a dotted insertion-type (FIG. 28E). Here, size, shape and other factors thereof may be appropriately selected and used according to specific conditions (e.g., step height, light exposing dosage, etc).

Hereinbelow, the sixth embodiment of the present invention will be described in detail as a preferred embodiment.

Photoresist was coated on a substrate with step having a 6000Å height, to give a relatively thin resist layer of 1.2 µm and relatively thick resist layer of 1.8 µm. The resist layer was exposed using the mask pattern having a horizontal additional pattern according to the sixth embodiment on the 1.2 µm-thick resist and using the conventional mask pattern without an additional pattern on the 1.8 µm-thick resist, and developed to form resist patterns. The size of the additional pattern was adjusted to obtain the same resist patterns for both portions of the resist. At this time, the wavelength ($\lambda$) of the exposing light was 0.365 µm, the NA value of the stepper was 0.5, the sigma value was 0.5, the dosage was 200 without defocus, and the developing time was 60 seconds.

Figure 29:
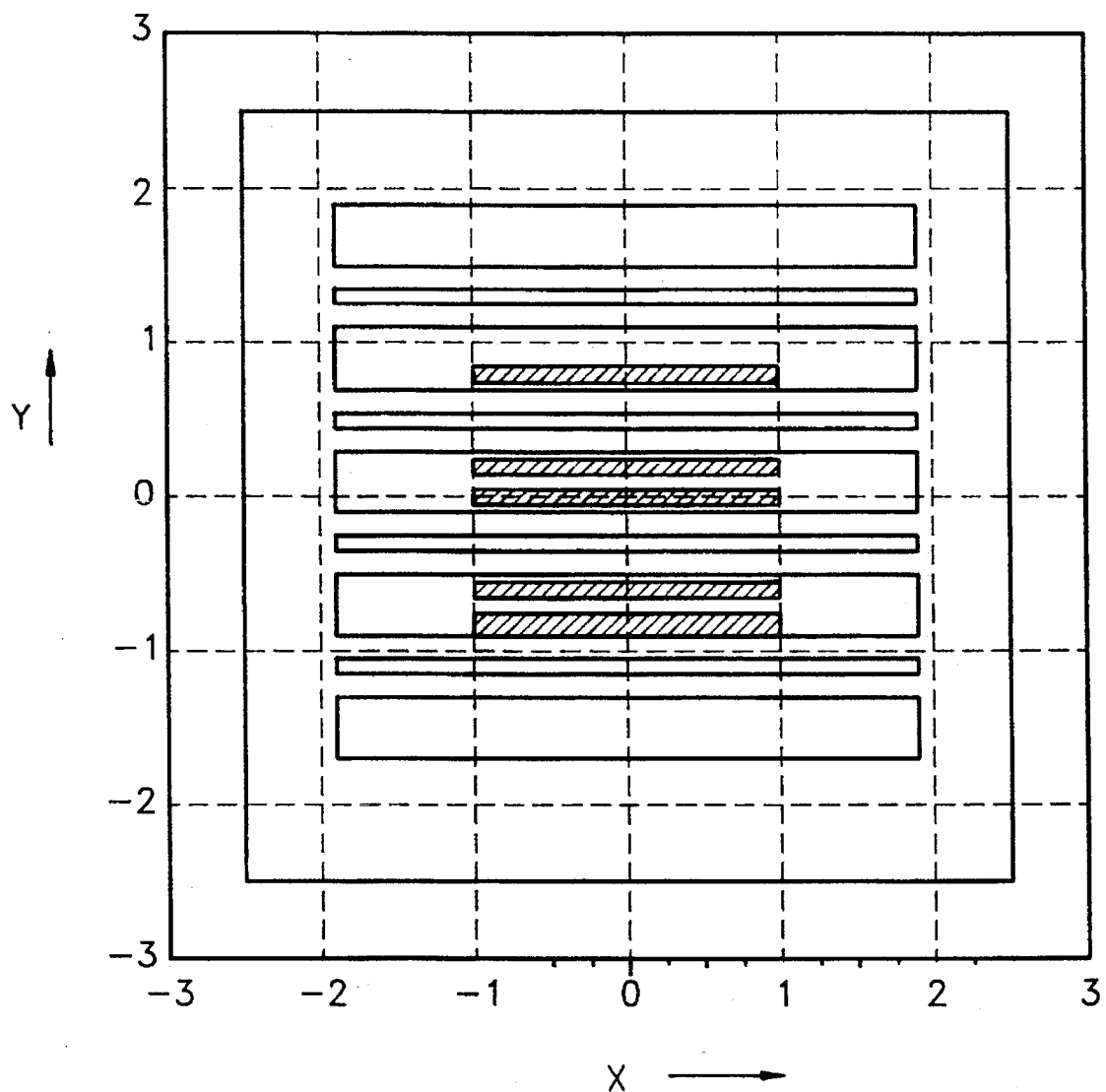
FIG. 29 is a simulation result of fine patterns using a 1.2 μm-thick resist layer and the mask pattern according to the sixth embodiment of the present invention.
Figure 30:
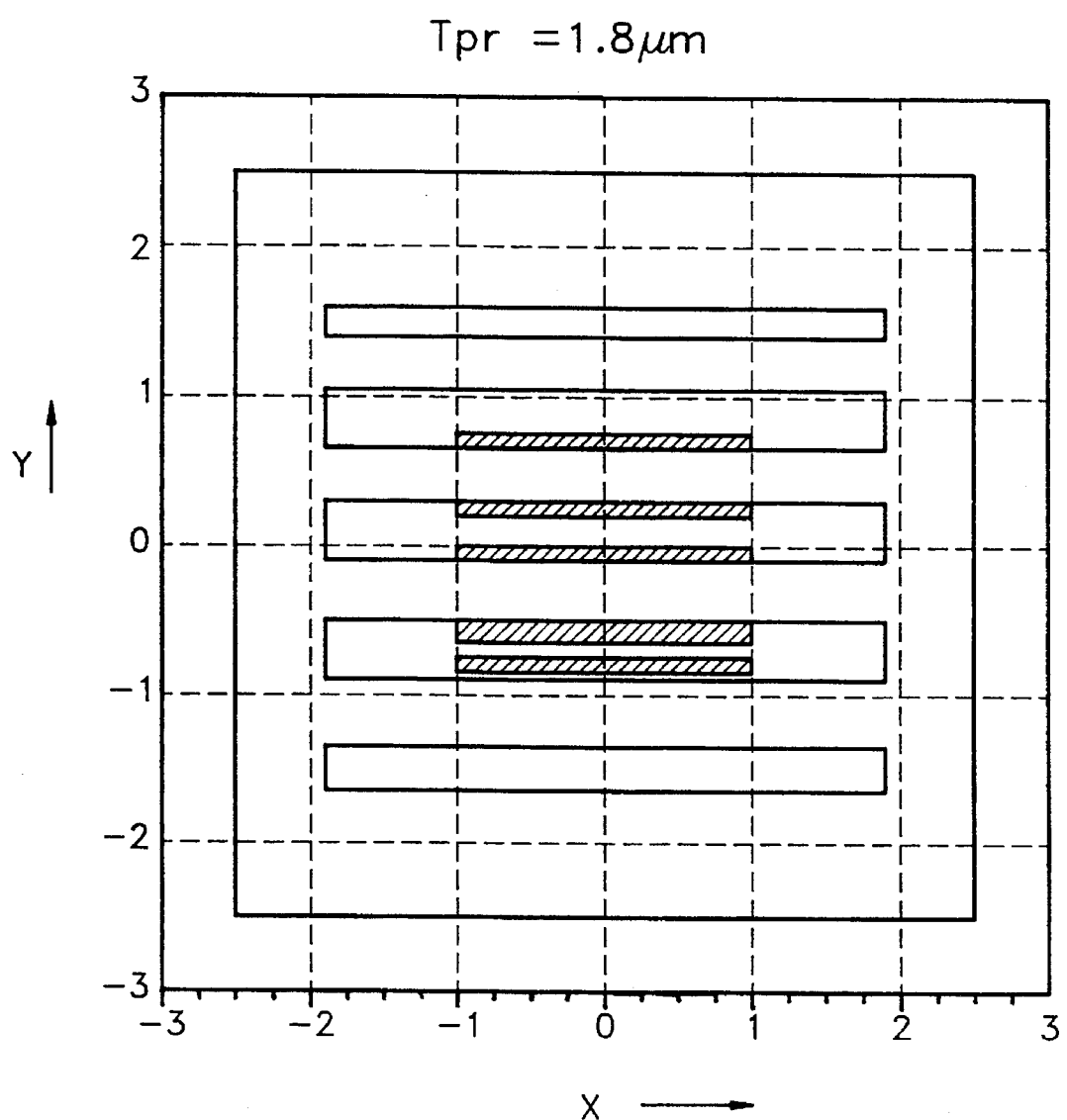
FIG. 30 is a simulation result of fine patterns using a 1.8 μm thick resist layer and the mask pattern according to the sixth embodiment of the present invention.

FIG. 29 is a simulation result of a fine pattern using the 1.2 µm-thick resist layer, and FIG. 30 is a simulation result of a fine pattern using a 1.8 µm-thick resist layer. Here, it is confirmed that resist patterns of the same size can be obtained for the resists having different thickness.

The mask pattern of the present invention is manufactured by including an additional pattern whose size does not exceed stepper resolution, and the dosage of the exposing light can be controlled by the thickness of the photoresist on a semiconductor substrate. That is, by simply including the additional pattern in a mask pattern, rectangular patterns having no pattern loss can be obtained and fine patterns without residue or bridges owing to the partial difference of the resist thickness at a step also could be obtained. Moreover, procedure stability is secured by preventing the deterioration of photolithography performance.

The present invention is not limited to the disclosed embodiments and it should be understood that various modifications in manufacturing a resist layer of fine patterns for various uses are possible within the spirit and scope of the attached claims.

What is claimed is:

1. A mask for forming resist patterns on a photoresist layer comprising:

a main mask pattern having light transmission areas generally defining a pattern to be formed on said photoresist layer, said main mask pattern permitting a specified phase of light to impinge upon said photoresist layer;

an additional mask pattern disposed at least partially within said light transmission areas at predetermined locations and constructed and arranged to reduce the amount of light that would otherwise travel through said transmission areas in the vicinity of said predetermined locations to inhibit said exposure light from overexposing said photoresist layer through said transmission areas at said predetermined locations without effecting any substantial shift in the phase of light impinging upon the photoresist layer.

2. A mask as claimed in claim 1, wherein said main mask pattern forms a matrix pattern.

3. A mask as claimed in claim 2, wherein said additional mask pattern has a resolution that ranges from $0.1\lambda/NA$ to $0.4\lambda/NA$, wherein $\lambda$ is a wavelength of the exposure light and NA is a numerical aperture of an exposing lens through which said exposure light travels.

4. A mask as claimed in claim 2, wherein said main mask pattern comprises main mask portions and said additional mask pattern comprises supplemental mask portions.

5. A mask as claimed in claim 4, wherein said supplemental mask portions of said additional mask pattern are connected to edges of said main mask portions comprising said main mask pattern forming said matrix pattern.

6. A mask as claimed in claim 4, wherein said additional mask pattern is disposed in crossing spaces of said matrix pattern.

7. A mask as claimed in claim 4, wherein said supplemental mask portions of said additional mask pattern extend between opposing edges of said main mask portions to form a supplemental line pattern.

8. A mask as claimed in claim 7, wherein said supplemental line pattern is provided along at least one direction among horizontal and vertical directions.

9. A mask as claimed in claim 8, wherein said matrix pattern is interconnected through said supplemental line pattern.

10. A mask as claimed in claim 4, wherein said mask is adapted to be used in manufacturing a semiconductor device from a stepped photoresist layer comprising a first resist portion thicker than a second resist portion, and wherein said additional mask pattern is adapted to be positioned over said second resist portion to inhibit exposure thereof during manufacture of said semiconductor device.

11. A mask as claimed in claim 10, wherein a resolution of said additional mask pattern is not more than that of a stepper.

12. A mask as claimed in claim 10, wherein said additional mask pattern is at least one selected from the group consisting of a dot pattern, a matrix pattern and a line pattern.

13. A mask as claimed in claim 12, wherein said additional mask pattern is at least one selected from the group consisting of an insertion pattern and a connection pattern.

14. A mask as claimed in claim 10, wherein said additional mask pattern is at least one selected from the group consisting of an insertion pattern and a connection pattern.

15. A mask pattern as claimed in claim 1, wherein said additional mask pattern does not alter the phase of light which travels through said transmission areas.

16. A method for forming patterns on a stepped photoresist layer, comprising the steps of:

forming a stepped photoresist layer on a substrate, said stepped photoresist layer having predetermined portions thinner than other portions;

exposing a desired portion of said photoresist layer to exposure light by using a mask pattern;

using an additional mask pattern to reduce the amount of exposure light incident on said predetermined thinner portions relative to the amount of exposure light incident on said other portions of said photoresist layer; and developing said exposed photoresist layer.

17. A manufacturing method of fine patterns as claimed in claim 16, wherein said step of exposing uses a matrix-type pattern as said mask pattern.

18. A mask for forming resist patterns on a photoresist layer, comprising:

a main mask pattern defining a first plurality of parallel light transmission areas and a second plurality of parallel light transmission areas, said first and second plurality of light transmission areas generally defining a pattern to be formed on a photoresist layer, said first and second plurality of parallel areas intersecting at a plurality of intersection areas, said main mask pattern permitting a specified phase of light to impinge upon said photoresist layer; and an additional mask pattern disposed in the vicinity of said intersection areas and constructed and arranged to reduce an amount of exposure light that would otherwise travel through said mask in the vicinity of said intersection areas without effecting any substantial shift in the phase of light impinging upon the photoresist layer.

19. A mask for forming resist patterns on a photoresist layer, comprising:

a main mask pattern having a plurality of light transmission areas generally defining a pattern to be formed on a photoresist layer, said main mask pattern permitting a specified phase of light to impinge upon said photoresist layer; and an additional mask pattern disposed at predetermined locations within said light transmission areas and constructed and arranged to reduce an amount of exposure light that would otherwise travel through said transmission areas in the general vicinity of said predetermined locations, said additional mask pattern thereby being adapted to reduce the exposure of said photoresist layer generally at areas on said pattern that are exposed to the exposure light traveling through the light transmission areas in the vicinity of said predetermined locations without effecting any substantial shift in the phase of light impinging upon the photoresist layer.

20. A mask as claimed in claim 19, wherein said main mask pattern forms a matrix pattern.

* * * * *